(12) United States Patent
Mizan et al.

(10) Patent No.: US 11,515,235 B2
(45) Date of Patent: Nov. 29, 2022

(54) DEVICE TOPOLOGY FOR LATERAL POWER TRANSISTORS WITH LOW COMMON SOURCE INDUCTANCE

(71) Applicant: GaN Systems Inc., Ottawa (CA)

(72) Inventors: Ahmad Mizan, Kanata (CA); Edward MacRobbie, Nepean (CA)

(73) Assignee: GaN Systems Inc., Kanata (CA)

( * ) Notice: Subject to any disclaimer, the term of this patent is extended or adjusted under 35 U.S.C. 154(b) by 134 days.

(21) Appl. No.: 17/117,449

(22) Filed: Dec. 10, 2020

(65) Prior Publication Data

US 2022/0139810 A1     May 5, 2022

Related U.S. Application Data

(63) Continuation-in-part of application No. 17/085,137, filed on Oct. 30, 2020.

(51) Int. Cl.
*H01L 23/482*     (2006.01)
*H01L 29/778*     (2006.01)
*H01L 29/20*       (2006.01)

(52) U.S. Cl.
CPC ...... *H01L 23/4824* (2013.01); *H01L 29/2003* (2013.01); *H01L 29/7786* (2013.01)

(58) Field of Classification Search
CPC ............ H01L 23/4824; H01L 23/528; H01L 23/5226; H01L 29/2003; H01L 29/41758; H01L 29/7786; H01L 29/8611
See application file for complete search history.

(56) References Cited

U.S. PATENT DOCUMENTS

| | | |
|---|---|---|
| 8,791,508 B2 | 7/2014 | Roberts et al. |
| 9,029,866 B2 | 5/2015 | Roberts et al. |
| 9,659,854 B2 | 5/2017 | Klowak et al. |
| 10,218,346 B1 | 2/2019 | Mizan et al. |
| 10,529,802 B2 | 1/2020 | Mizan et al. |

(Continued)

OTHER PUBLICATIONS

Dixit, et al.; Advanced Packaging; "Wire Bonding Considerations; Design Tips for Performance and Reliability"; Jul. 2006; 4 pages.

(Continued)

*Primary Examiner* — Eric A. Ward
(74) *Attorney, Agent, or Firm* — Miltons IP/p.i.

(57) ABSTRACT

Circuit-Under-Pad (CUP) device topologies for high-current lateral power switching devices are disclosed, in which the interconnect structure and pad placement are configured for reduced source and common source inductance. In an example topology for a power semiconductor device comprising a lateral GaN HEMT, the source bus runs across a centre of the active area, substantially centered between first and second extremities of source finger electrodes, with laterally extending tabs contacting the underlying source finger electrodes. The drain bus is spaced from the source bus and comprises laterally extending tabs contacting the underlying drain finger electrodes. The gate bus is centrally placed and runs adjacent the source bus. Preferably, the interconnect structure comprises a dedicated gate return bus to separate the gate drive loop from the power loop. Proposed CUP device structures provide for lower source and common source inductance and/or higher current carrying capability per unit device area.

25 Claims, 11 Drawing Sheets

(56) References Cited

U.S. PATENT DOCUMENTS

| | | |
|---|---|---|
| 2004/0119154 A1 | 6/2004 | Briere |
| 2011/0241126 A1* | 10/2011 | Herberholz .......... H01L 29/402 |
| | | 257/E21.409 |
| 2014/0103537 A1* | 4/2014 | Kaibara ................ H01L 24/08 |
| | | 257/773 |
| 2016/0087074 A1* | 3/2016 | Prechtl ............. H01L 23/53223 |
| | | 438/652 |
| 2018/0026125 A1 | 1/2018 | Liao et al. |
| 2019/0081141 A1* | 3/2019 | Mizan ................... H01L 23/528 |
| 2019/0386128 A1* | 12/2019 | Lin ..................... H01L 29/4236 |
| 2020/0091291 A1 | 3/2020 | Mizan et al. |

OTHER PUBLICATIONS

Reiner, Richard; "Design and Characterization of Highly-Efficient GaN-HEMTs for Power Applications"; Nov. 2006; 147 pages.

\* cited by examiner

*Die 400 with active area 402.*
*First conductive layer (ohmic contact layer) defines drain finger electrodes 414 and source finger electrodes 412 (each split in two parts) to leave space for gate bus.*

*Auxiliary/gate metal layer (may be referred to as M0) defines gate finger electrodes 416 and gate bus 426.*

*Gate finger electrodes wrap around end of source fingers.*

Sustained oscillation due to high CSI

Simulation in double pulse circuit:

E-on = 19 uJ with CSI = 450pH

E-on = 20.8uJ with CSI = 800pH

DEVICE TOPOLOGY FOR LATERAL POWER TRANSISTORS WITH LOW COMMON SOURCE INDUCTANCE

CROSS-REFERENCE TO RELATED APPLICATION(S)

This application is related to U.S. patent application Ser. No. 16/688,008 filed Nov. 19, 2019 entitled "Scalable Circuit-Under-Pad Device Topologies for Lateral GaN Power Transistors", which is incorporated herein by reference in its entirety.

This application is a continuation-in-part of U.S. patent application Ser. No. 17/085,137 filed Oct. 30, 2020, entitled "Device Topologies for High Current Lateral Power Semiconductor Devices", which is incorporated herein by reference in its entirety.

TECHNICAL FIELD

This invention relates to device topologies for high current lateral power switching devices, with particular application to power switching systems comprising high current lateral GaN power transistors.

BACKGROUND

In the context of this disclosure, Circuit-Under-Pad, or CUP, refers to semiconductor device topologies in which metal contact pads are provided over areas of underlying active devices or active integrated circuitry. The metal pads are defined by one or more on-chip conductive metallization layers and provide for die-to-package interconnections which are distributed over the active device area. The pads are vertically interconnected to the underlying regions of the active circuitry, e.g. using a plurality of micro-vias. In contrast, in traditional, non-CUP, device topologies, on-chip metal interconnect, comprising conductive tracks, laterally interconnects active device areas to busses placed between active device areas, and external contact pads to the buses are provided, typically arranged around the periphery of the chip. However, in the latter structures, the metal interconnect buses and contact pads are provided on inactive regions of the chip, which take up significant area in between active device regions and/or around edges of the die, limiting the usable fraction of the die area that is available for the active device area.

For wirebonded packaging, CUP device structures may also be referred to as Bondpad-Over-Active device structures. CUP device structures are effective in increasing the usable fraction of die area available for active circuitry, and potentially provide for physical and electrical shielding of underlying circuitry, and more planar encapsulation. On the other hand, for application to power switching devices, such as high-current lateral GaN transistors, known implementations of CUP device topologies have one or more limitations. Performance considerations for high current power switching devices include increasing current carrying capability per unit device area, and reducing on-chip parasitic impedances, i.e. parasitic resistances, capacitances and inductances, e.g. gate loop inductance.

Improved or alternative device topologies and packaging solutions for high current, lateral GaN transistors are disclosed, for example, in United States patent application No. U.S. Ser. No. 15/704,458, entitled "High Current Lateral GaN Transistors with Scalable Topology and Gate Drive Phase Equalization", now U.S. Pat. No. 10,218,346 issued Feb. 26, 2019; and in U.S. patent application Ser. No. 15/988,453, filed May 24, 2019, now U.S. Pat. No. 10,529,802, entitled "Scalable Circuit-Under-Pad Device Topologies for Lateral GaN Power Transistors".

The above referenced patents and patent applications are incorporated herein by reference in their entirety.

As described in the above referenced patents and patent applications, and references cited therein, high current lateral GaN power transistors may be formed on a large area die comprising multiple transistor elements which are connected in parallel, i.e. to provide a scalable, large gate width, device with appropriate current carrying capacity. These transistor elements may be referred to as transistor sections or islands. For improved performance, it is desirable to reduce parasitic impedances of the power switching device and the device packaging. For example, common source inductance may cause switching instabilities and switching losses. Thus, for lateral GaN power switching devices, it is desirable to provide device topologies with low common source inductance, for improved stability and reduced switching losses Thus, there is a need for improved or alternative device topologies for high current, lateral power semiconductor devices, which mitigate or circumvent one or more limitations of known device topologies, particularly for application to power switching systems comprising high current lateral GaN power transistors.

SUMMARY OF INVENTION

The present invention seeks to provide improved or alternative device topologies for lateral power semiconductor devices, which are applicable for power switching devices and power switching systems comprising high current, lateral power transistors.

Aspects of the invention provide device topologies for high current lateral power transistors, such as GaN HEMTs, wherein the on-chip metallization provides at least one of higher current carrying capability per unit area and reduced interconnect resistances and inductances, for example, reduced source inductance and common source inductance.

One aspect of the invention provides a power semiconductor device structure comprising:
a lateral transistor comprising a substrate providing a device area, an active region formed on the device area; a layer of conductive metallization defining an array of source and drain finger electrodes on the active region, the active region having a width and a length, each source and drain finger electrode extending across the width of the active region in a first direction between first and second edges of the device active region,
a gate metal layer defining gate finger electrodes extending between each adjacent source and drain finger electrode;
an interconnect structure comprising interconnect metallization and intermetal dielectric;
the interconnect metallization defining a drain bus and a source bus;
the source bus extending in a second direction (lengthwise) and being interconnected to the source finger electrodes;
the drain bus extending in the second direction (lengthwise) and being interconnected to the drain finger electrodes; and
a source pad and a drain pad for external contacts being provided on the source bus and the drain bus;

wherein: the source bus runs near a centre of the source finger electrodes, and the drain bus is spaced from the source bus by at least a minimum required separation for a rated operational voltage.

For example, the source bus runs across the centre region, e.g. is substantially centered on each source finger electrode, to reduce or minimize the source and common source inductance. For example, the gate bus runs across the centre region of the device area, close to, or overlapping the source bus, to reduce or minimize the gate loop inductance. The device structure may comprise a dedicated gate return bus, to more effectively couple the gate and gate return buses, hence lowering the gate loop inductance. A dedicated gate return bus also reduces variations in gate inductance between the gate pad and individual gate fingers. At least one gate pad and optionally, at least one gate return pad is provided. In some embodiments, the device structure may comprise first and second gate pads and first and second gate return pads, e.g. at each end of the second edge of the die, to provide more flexibility for external connections.

Centralized placement of the source bus allows for the inductance of the source metal interconnections to be reduced or optimized. The impedance of the source interconnections goes directly into the gate loop, and the inductive part of this impedance may make a switching circuit unstable, extend the transient part of the switching transient regime, and contribute to increased switching losses. Positioning the source bus in a centre region of the active area, between extremities of the source fingers, reduces the source inductance and common source inductance. Reduced common source inductance provides for lower switching losses and higher stability, e.g. for switching applications such as buck and half-bridge converters. Positioning of the gate bus in the center allows for better coupling with the source bus to provide lower gate loop inductance.

In some embodiments, the interconnect metallization comprises a gate bus extending in the second direction and interconnecting the gate finger electrodes to gate contact areas. In some embodiments, the gate metal layer provides a gate bus that runs between first and second portions of the source fingers electrodes and drain finger electrodes. The gate bus extending in the second direction and interconnecting the gate finger electrodes to gate contact areas. The interconnect metallization may define a gate return bus overlying the gate bus, the gate return bus being interconnected to gate return contact areas. Optionally, first and second gate pads and first and second gate return pads may be provided at each end, e.g. near the second edge of the die. Advantageously, provision of a dedicated gate return bus reduces coupling between the gate drive loop and the power loop and reduces the gate loop inductances.

The source bus may comprise tabs (lateral extensions/castellations) that extend laterally over and interconnect with the source finger electrodes, and the drain bus may comprise tabs (lateral extensions/castellations) that extend laterally over and interconnect with the drain finger electrodes.

In some embodiments, the source bus runs across the centre region and is substantially centered between first and second edges of the active region, with interconnections to each source finger electrode. The drain bus is ideally placed as close as possible to the source bus. In practice the drain bus and source bus are separated by at least a minimum separation required for a specified operational voltage, e.g. for electrical safety to comply with creepage and clearance requirements, and/or to comply with design rules and manufacturing constraints. For example, the lateral power transistor may be a lateral GaN power transistor rated for operational voltage of ≥100V or ≥600V. For example, based on a general rule of not exceeding an electric field of 3V/μm, for 600V operation, a minimum spacing of ≥200 μm between the source bus and the drain bus would be required.

In another aspect, there is provided a power semiconductor device structure comprising:
a lateral power transistor, such as a lateral GaN HEMT, comprising a substrate providing a device area, an active region formed on the device area; a layer of conductive metallization defining an array of source and drain finger electrodes on the active region, the active region having a width and a length, each source and drain finger electrode extending across the width of the active region in a first direction between first and second edges of the device active region,
a gate metal layer defining gate finger electrodes extending between each adjacent source and drain finger electrode, the gate metal layer defining a gate bus interconnecting the gate finger electrodes to gate contact areas, the gate bus running in a second direction between first and second portions of the source finger electrodes and drain finger electrodes;
an interconnect structure comprising first and second levels of interconnect metallization and intermetal dielectric;
the first level of interconnect metallization defining:
　source fingers interconnected to the source finger electrodes and a source bus; drain fingers interconnected to the drain finger electrodes; a source bus extending in the second direction and being interconnected to the source fingers; a gate return bus running in the second direction over the gate bus interconnected to gate return contact areas;
the second level of interconnect metallization defining:
　a source bus having laterally extending tabs interconnected to the source bus and source fingers of the first level of interconnect metallization;
　a drain bus having laterally extending tabs interconnected to the drain fingers of the first level of interconnect metallization;
　gate contact areas interconnected to the gate bus and gate return contact areas interconnected to the gate return bus;
a source pad for external contacts being provided on the source bus;
a drain pad for external contacts being provided on the drain bus;
gate pads for external contacts being provided on the gate contact areas and gate return pads for external contacts being provided on the gate return contact areas
wherein: the source bus runs across a centre region of the source finger electrodes.

In example embodiments, the gate bus and the gate return bus run adjacent to the source bus, either between the source bus and the drain bus or on the other side of the source bus. For example, the source bus is substantially centered across the width of the active area, between first and second edges of the active region, with interconnections to each source finger electrode. The drain bus and the source bus are separated by at least a minimum separation for a rated operational voltage. Where the lateral power transistor is GaN power transistor such as a GaN HEMT it may be rated for operational voltage of e.g. ≥100V or ≥600V, and an appropriate minimum spacing between the source pad and drain pad would be required for electrical safety. For example, the pad placement and dimensions of the interconnect structure may be configured, e.g. optimized by a multidimensional optimization process, to meet specific design objective, such as, to minimize or reduce a source and common source inductance, or to maximize or increase a current carrying capacity per unit area of the die.

Thus, device topologies are provided for lateral power transistors, such as lateral GaN power transistors, for reduced source and common source inductance, with particular application for power switching devices comprising large area, high current lateral GaN transistors.

The foregoing and other features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Figure 1A:
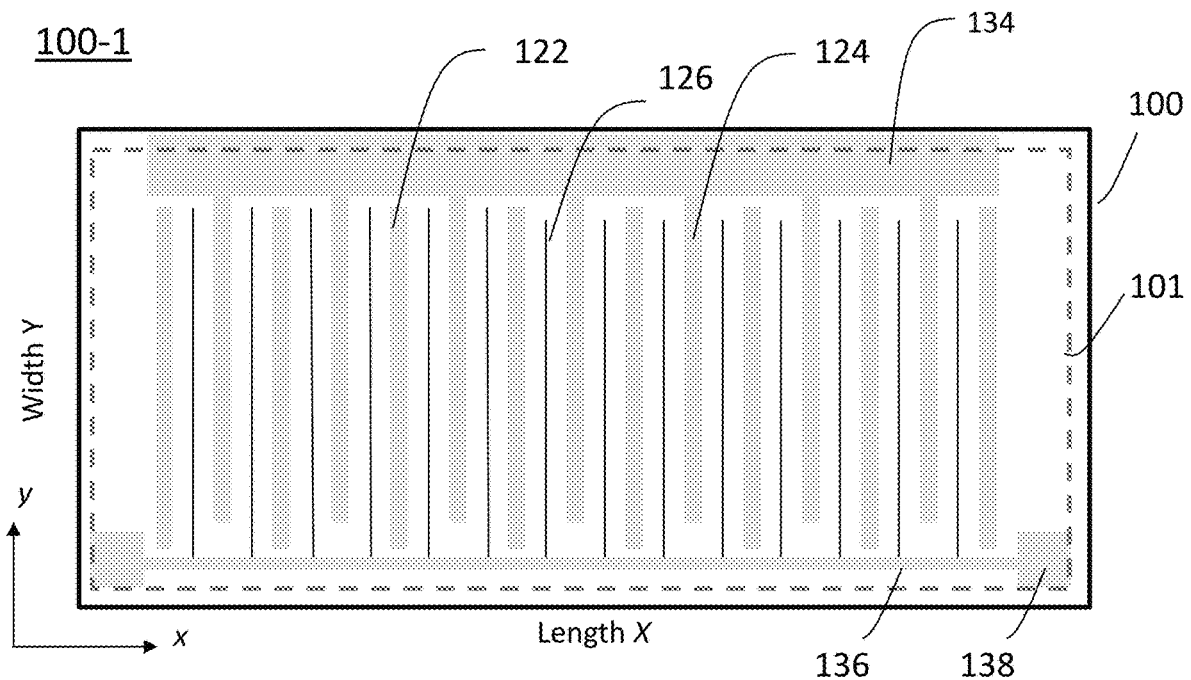
FIGS. 1A and 1B (Prior art) shows schematic diagrams to illustrate an interconnect topology of first and second levels of conductive interconnect metallization of a semiconductor device comprising a power transistor, wherein source, drain and gate buses are provided near edges of the device area (near periphery of the die)
Figure 1B:
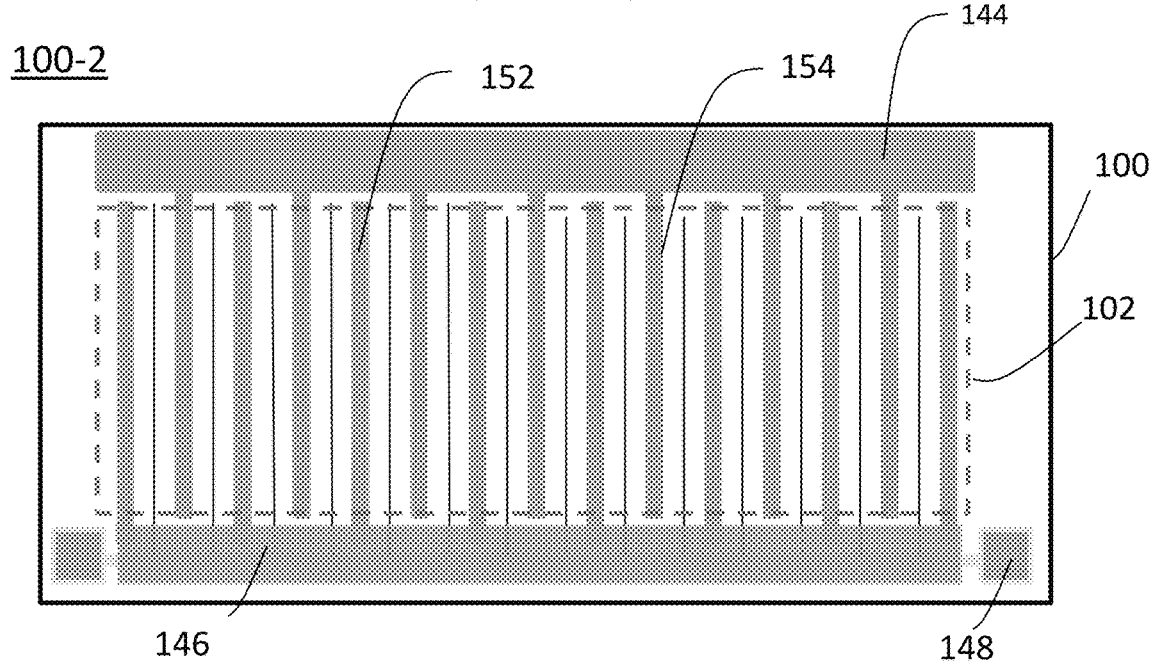

FIGS. 1A and 1B (Prior art) show schematic diagrams to illustrate a device topology comprising a semiconductor die 100 defining a device area and first and second levels of metallization of a semiconductor device comprising a power transistor, wherein source, drain and gate buses are positioned near edges of the device area, i.e. at the periphery of the die 100. For example, for a lateral GaN power transistor, such as a GaN HEMT, an active region comprising a GaN/AlGaN heterostructure is formed on the device area of a semiconductor substrate. A first conductive layer, e.g. an ohmic contact layer, defines source finger electrodes and drain finger electrodes on the active area of the die, and a separate gate metal layer defines gate finger electrodes running between adjacent source and drain electrodes. At least first and second conductive interconnect metal layers are used to define an interconnect structure for the source, drain and gate fingers, comprising a source bus, a drain bus, and a gate bus, with interconnections between the conductive layers.

FIG. 1A shows a first plan view 100-1 to illustrate patterning of a first level of conductive interconnect metallization. An array of source finger electrodes 122 and drain finger electrodes 124 are defined on the active area 101 of the die 100, extending in a first direction across the width y of the active area. Gate finger electrodes 126 run between each adjacent source and drain finger electrode. In this example, the drain finger electrodes are connected to a drain bus 134 running near first edge of the device area. Gate finger electrodes are connected to a gate bus 136 running along a second edge of the die. FIG. 1B shows a second plan view 100-2 to illustrate patterning of a second level of conductive interconnect metallization. The second level of metallization defines a source bus 142, drain bus 144, and gate contact areas 146. Lateral extensions (tabs or castellations) 152 extend from the source bus 142 and interconnect with the source finger electrodes 122 of the first level of metallization. Lateral extensions (tabs or castellations) 154 extend from the drain bus 144 and interconnect with the underlying the drain finger electrodes 124 of the first level of metallization. First and second levels of metallization are separated by intermetal dielectric (not shown), and source, drain and gate interconnections between respective source, drain and gate parts of first and second levels of metallization are provided through openings in the intermetal dielectric, e.g. through conductive vias or microvias.

For simplicity, two levels of interconnect metallization are shown. Each level of interconnect metallization may comprise one conductive metal layer or multiple conductive metallization layers to provide conductive traces of a required thickness and lateral dimensions.

Figure 2A:
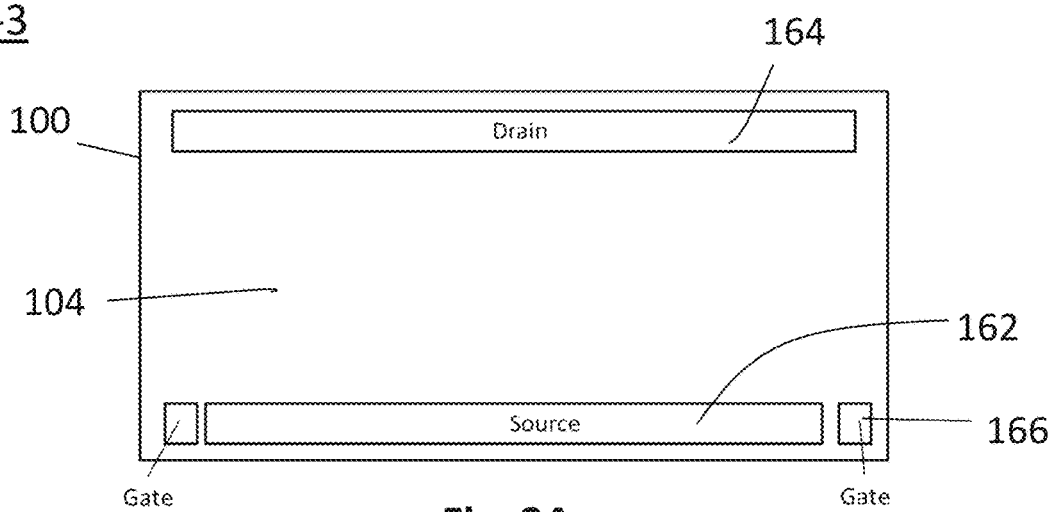
FIG. 2A (Prior art) shows a schematic plan diagram of a semiconductor device comprising a power transistor having external contact pads for source, drain, and gate connections.
Figure 2B:
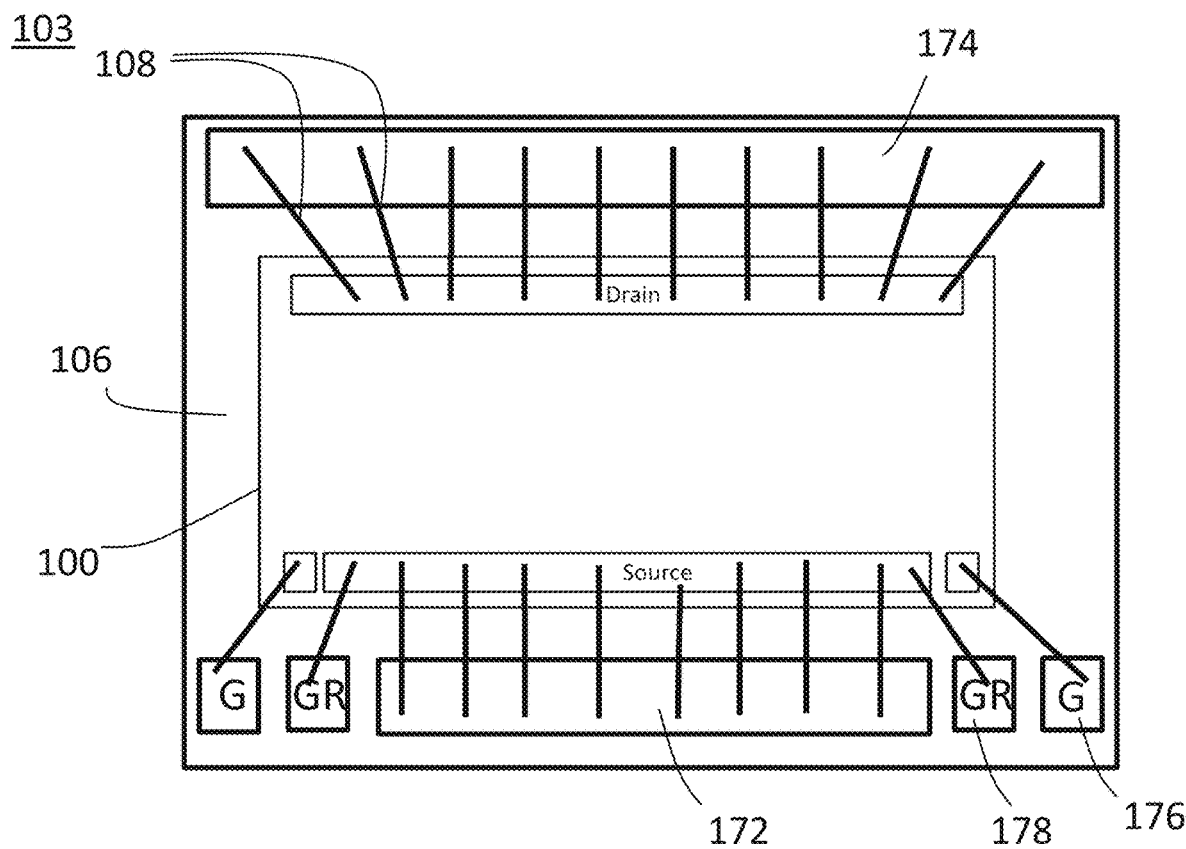
FIG. 2B (Prior art) shows a schematic diagram of part of a wirebonded package assembly comprising the semiconductor device of FIG. 2A mounted on a package substrate with wirebonded connections to respective source, drain, gate pads of the package substrate.

For a lateral power transistor such as shown in FIGS. 1A and 1B, a layer of pad metal defines the external source, drain contact and gate contact areas (pads), which are provided on a front-side of the die, as illustrated schematically in FIG. 2A (Prior art). The external contact areas may be called pads or lands, and for wirebonded packaging, they may be referred to as bondpads. FIG. 2A shows a schematic diagram of an external view 100-3 of the front side of a semiconductor device (die) 100 comprising the power transistor, showing the die passivation dielectric 104 with openings to the pad metal for an external contact pad for the source 162, an external contact pad for the drain 164, and dual gate contact pads 166. FIG. 2B (Prior art) shows a schematic diagram of a plan view of part of a wirebonded package 103 comprising the semiconductor device 100 of FIG. 2A mounted on a package substrate 106 with a plurality of wirebonded connections 108 to the respective source pad 172, drain pad 174, gate pads 176 and gate return pads 178 of the package substrate 106.

Figure 3:
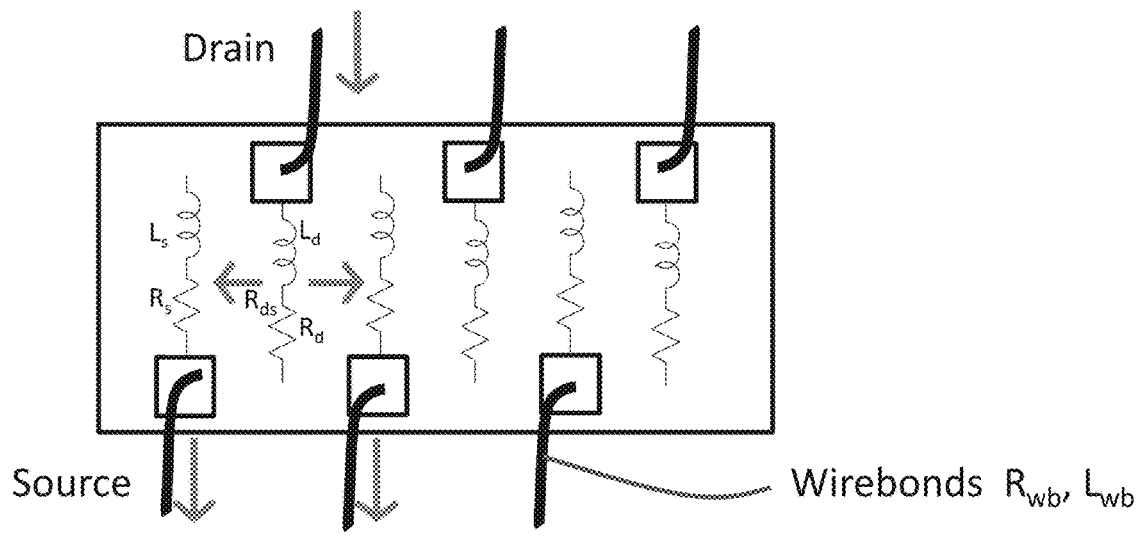
FIG. 3 (Prior art) shows a schematic diagram to represent on-chip parasitic inductances and resistances for a wirebonded power transistor die, such as illustrated schematically in FIG. 2B.

For a lateral GaN power transistor in a wirebonded package, the on-chip (die) metal interconnect and the package wirebonds contribute to parasitic inductances and resistances. Referring to the schematic diagram shown in FIG. 3, parasitic impedances include inductances and resistances, e.g. device resistance includes the drain-source resistance $R_{ds}$ of the channel region, and the inductance and resistance of the on-chip metal defining the drain fingers and source fingers, $R_s$, $R_d$, $L_s$ and $L_d$, and wirebond inductance and resistance. In FIG. 3, gate connections are omitted for clarity, although gate parasitics would include gate resistance $R_g$ and gate inductance $L_g$. Wirebonds also contribute to parasitic resistances and inductances, indicated as $R_{wb}$ and $L_{wb}$.

To reduce wirebond resistance and inductances, multiple wirebonds, e.g. 25 to 35 wirebonds, may be provided to each of the source pads and drain pads, as illustrated schematically in FIG. 2B. In GaNPx type embedded packaging, wirebonds are eliminated and low inductance package interconnect is provided. For some applications, GaNPx type embedded packaging is beneficial, e.g. when the power semiconductor die comprises a low inductance interconnect redistribution layer (RDL), such as a copper (Cu) RDL, or other lower inductance on-chip interconnect topology. On the other hand, for device topologies such as shown in FIGS. 1A, 1B, 2A and 2B, wirebonded packaging is widely available, and is used for higher volume, lower cost packaging of power semiconductor devices.

For the general device topology illustrated in FIGS. 1A, 1B, and 2A, the source, drain and gate finger electrodes extend in a first direction, e.g. a y direction, across the width Y of the active area, between first and second edges of the active region. The source, drain and gate buses extend in a second direction, orthogonal to the first direction, e.g. an x direction, along the length X of the active area. The device area has an aspect ratio of X:Y. The unit building block of this topology can be considered to be a cell or island comprising a plurality of source, drain and gate electrodes as illustrated schematically. To limit on-chip impedances in the source, drain and gate interconnect, the lengths of the source, drain and gate finger electrodes, i.e. y-dimension is restricted. That is increasing the length of the source and drain fingers extending between the source and drain buses increases the impedance in proportion to the length, as illustrated schematically in FIG. 3 (Prior Art). For a high current lateral GaN power transistor as illustrated schematically in FIGS. 1A, 1B, 2A and 2B, the drain and source pads are placed near edges of the die, so that the current path is the entire width of the die. To increase the gate width $w_g$, and therefore increase the current carrying capacity of the chip, more cells or islands are added in the x-direction, to increase the x-dimension. High current carrying capability per unit area with lower on-chip resistances and inductances requires a die having a high aspect ratio (i.e. ratio of x-dimension to y-dimension).

Figure 4:
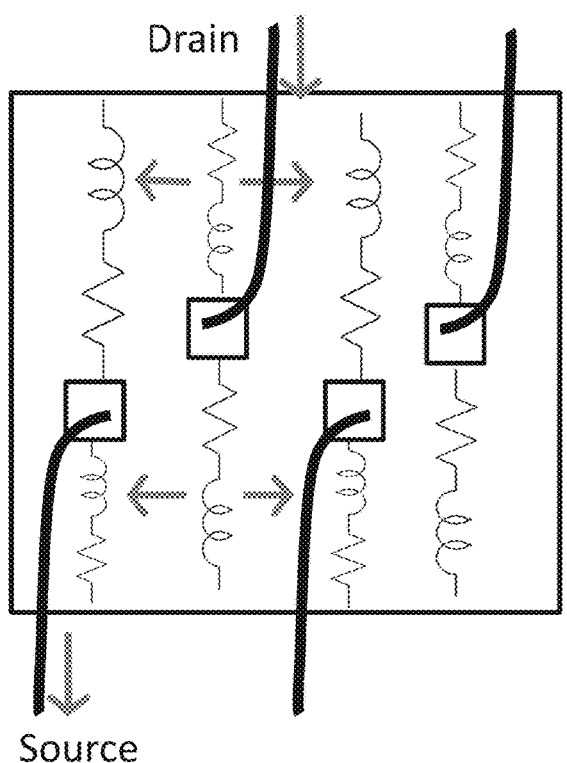
FIG. 4 shows a schematic representation of parasitic inductances and resistances for a power transistor die in a wirebonded package of a first example.

Referring to FIG. 4, in a first example, moving the drain pad and source pad towards the middle of the die effectively reduces the length of the current path in the source interconnect metal and in the drain interconnect metal, and therefore reduces the interconnect metal resistance and inductance. That is, across the width of the active region, each length the source metal and drain metal is divided in two and connected in parallel to the respective source and drain pads. Ideally, in this configuration the source pad and drain pad would be placed as close as possible to the centre of the die, i.e. close to the centre of each source and drain finger electrode to reduce the current path length for both source and drain interconnect metal of the interconnect structure. In practice, for high voltage operation, e.g. ≥100V or ≥650V, at least a minimum specified separation must be maintained between the source bus and drain bus and their respective contact pads, e.g. to comply with design rules and manufacturing constraints.

Figure 5:
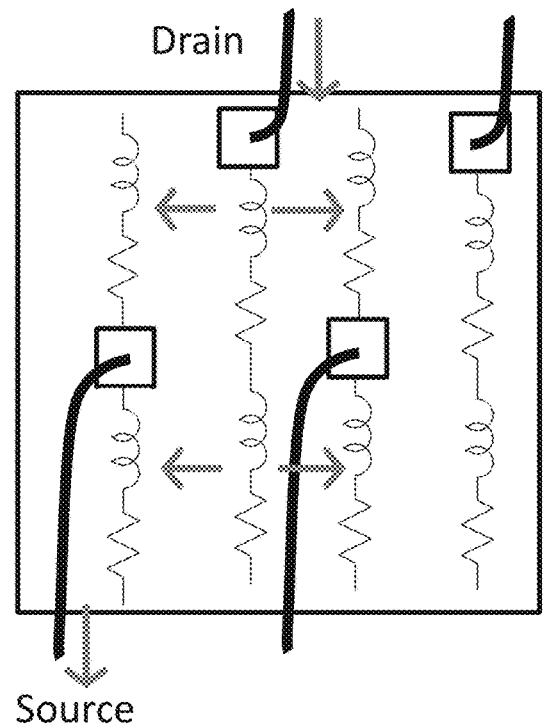
FIG. 5 shows a schematic representation of parasitic inductive and resistive impedances for a power transistor die in a wirebonded package of a second example.

Instead of optimizing each of the source and drain and gate interconnect, e.g. positioning of both the source and drain pads, e.g. to minimize both source and drain interconnect impedances, the die impedance can be minimized for only one of the drain interconnect and the source interconnect. Since the impedance of the source interconnect goes directly into the gate loop, the source interconnect is in common with the power loop and the gate loop. The inductive part of the source interconnect impedance may make a switching circuit unstable and extend the transient part of a switching transient regime. The latter contributes to higher switching losses. That is the inductive properties of the on-chip source interconnect create a magnetic field while current is flowing, which is not instantaneously stopped when current is switched off. The magnetic field of an inductor causes ringing, which may create a sustained oscillation after current switching. Thus, in a second example, the device topology is optimized to reduce impedance of the source interconnect connections only, e.g. to minimize on-chip source inductance and common-source-inductance (CSI), as illustrated schematically in FIG. 5.

Figure 6A:
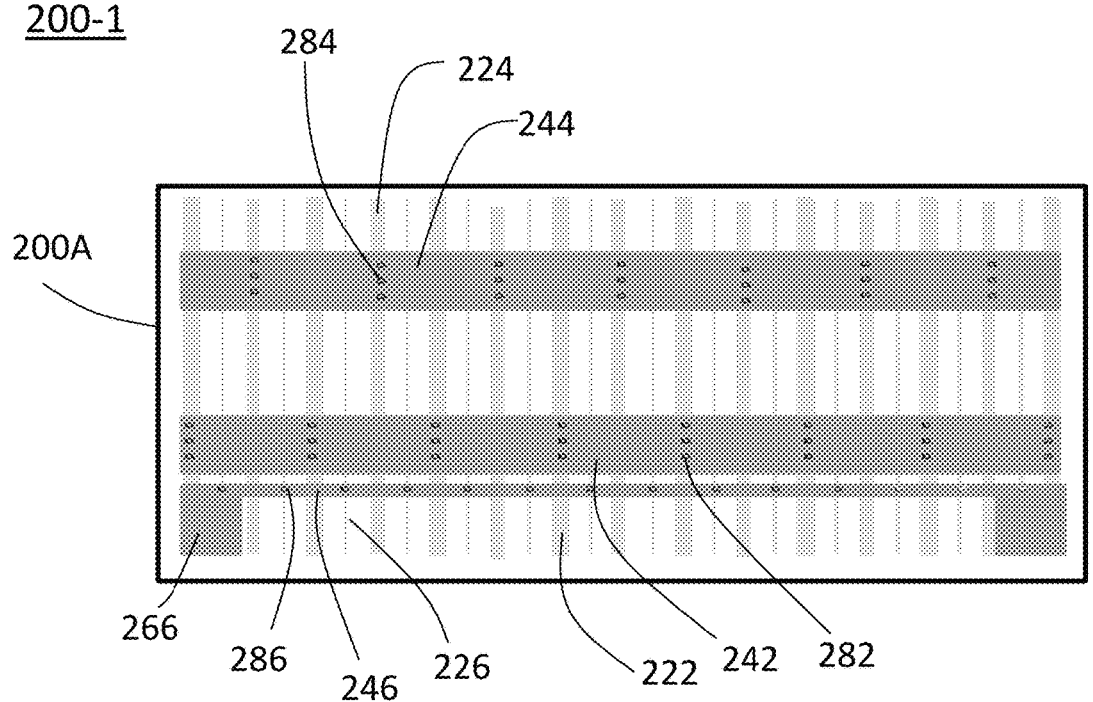
FIGS. 6A and 6B shows simplified schematic diagrams to illustrate conceptually a device structure comprising a lateral GaN power transistor comprising an interconnect structure for an example optimized for reduced source and drain resistance.
Figure 6B:
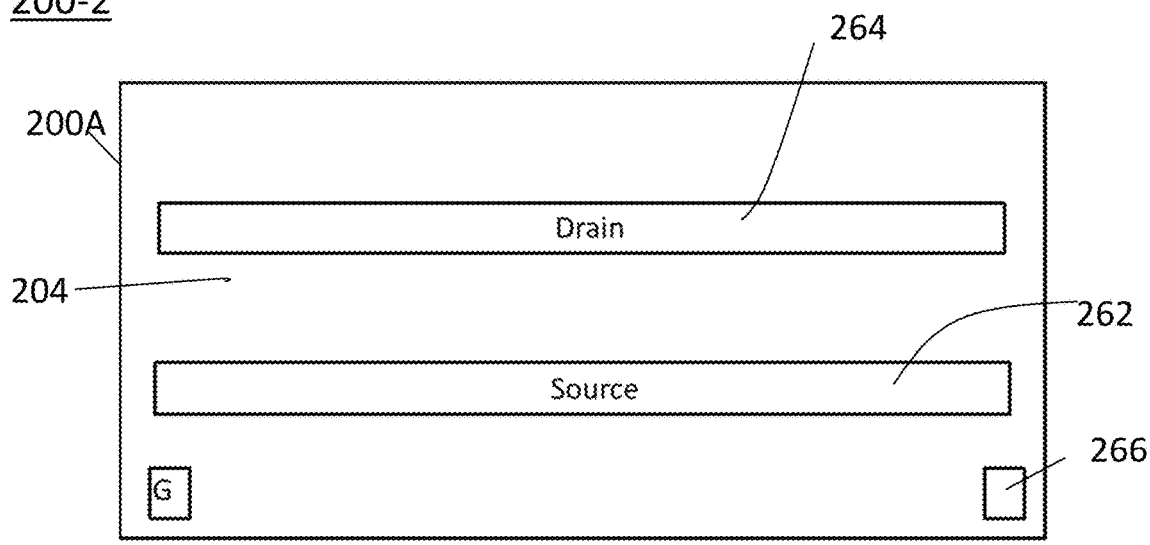

FIGS. 6A and 6B shows simplified schematic diagrams 200-1 and 200-2 to illustrate conceptually an implementation of a semiconductor device structure 200A comprising a lateral GaN power transistor of an example in which pad placement is optimized to reduce drain resistance and source resistance, e.g. as disclosed in the above referenced related application no. U.S. Ser. No. 17/085,137. The semiconductor die comprises a substrate providing a device area, on which is provided an active region. For example, for a GaN HEMT, an active area is provided by a GaN/AlGaN heterostructure that provides an active region comprising a 2DEG channel. Source, drain and gate electrodes are defined on the active region. For example, a first conductive layer, e.g. an ohmic contact layer, defines source finger electrodes and drain finger electrodes extending in a first direction across a width of an active region between first and second edges of the die. A gate metal layer defines gate finger electrodes extending between the source and drain finger electrodes. An interconnect structure, comprising source, drain and gate interconnects, is defined by first and second levels of interconnect metallization, and respective intermetal dielectric layers. The source, drain and gate interconnects are interconnected to respective underlying source, drain and gate finger electrodes. For example, as illustrated schematically in the simplified structure 200-1 shown in FIG. 6A, comprises a first conductive layer defines source finger electrodes 212 and drain finger electrodes 214. A gate metal layer defines gate finger electrode 216 between adjacent source and drain finger electrodes. First and second levels of interconnect metallization are patterned to provide a source bus 242 and a drain bus 244. The first and second levels of interconnect metallization are separated as appropriate by one or more intermetal dielectric layers. The drain bus 244 is interconnected by conductive vias 284 to the underlying drain finger electrodes 214. The source bus 242 is interconnected by conductive vias 282 to the underlying source finger electrodes 212. The source bus 242 and the drain bus 244 are spaced from first and second edges, e.g. as shown schematically in FIG. 4. The source bus and the drain bus are spaced by a minimum required spacing, e.g. for a rated operational voltage, or to comply with other design rules and manufacturing requirements. A gate bus 236 interconnects the gate finger electrodes 216 to gate contact area 266. The gate bus runs adjacent to the source bus. As shown schematically in FIG. 6B, pad metal is provided on the drain bus, source bus and gate contact areas, with openings in the die passivation 204 for a drain pad 264, source pad 262 and gate pads 266.

Figure 7A:
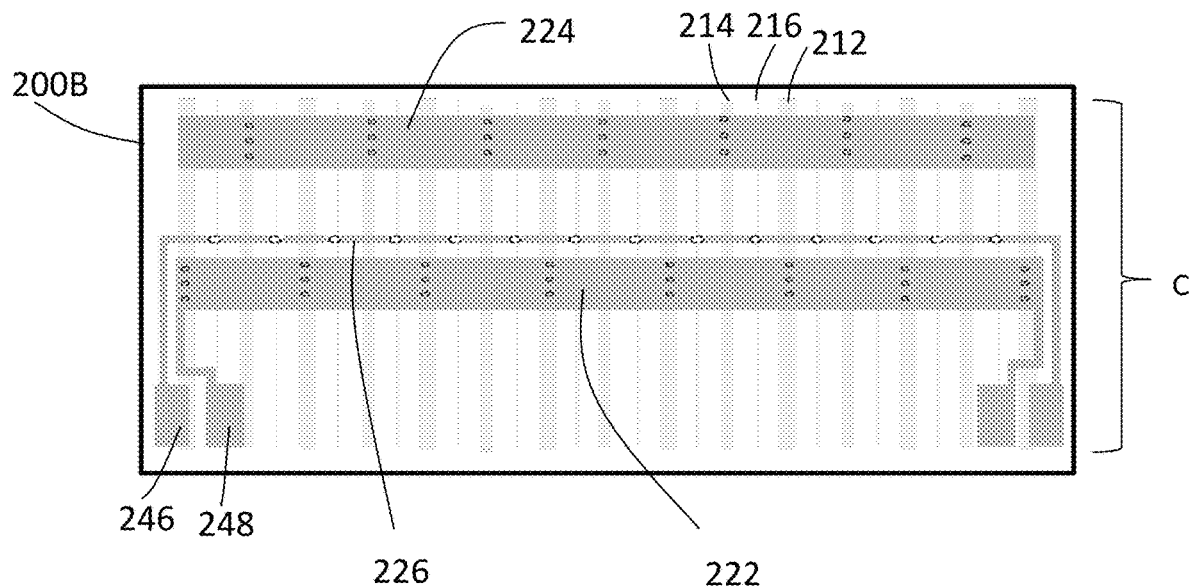
FIGS. 7A and 7B shows simplified schematic diagrams to illustrate conceptually a device structure comprising a lateral GaN power transistor comprising an interconnect structure for a first embodiment optimized for reduced common source inductance.
Figure 7B:
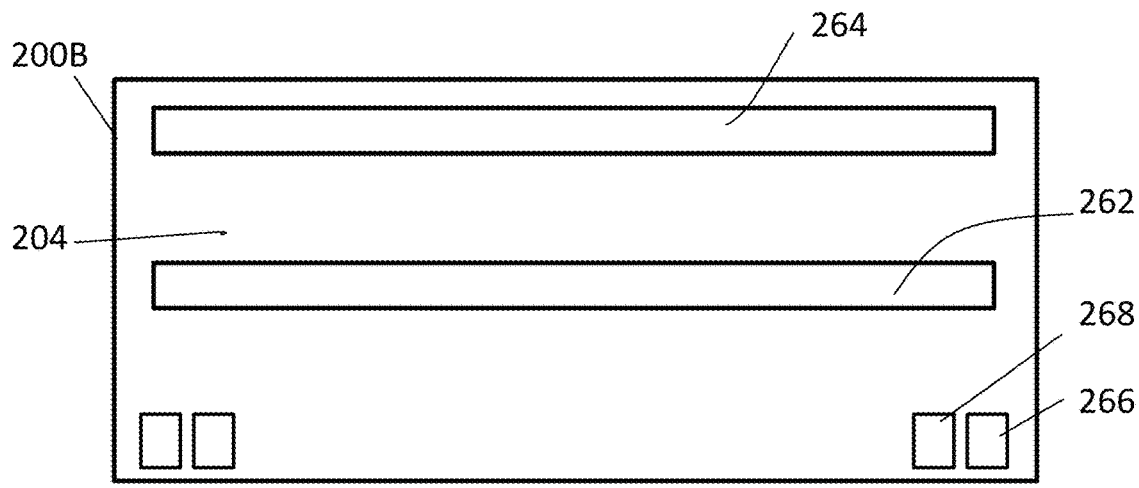

FIGS. 7A and 7B shows simplified schematic diagrams 200-3 and 200-4 to illustrate conceptually an implementation of a semiconductor device structure 200B comprising a lateral GaN power transistor of a first embodiment for which pad placement is optimized for reduced source inductance and common source inductance. The semiconductor die comprises a substrate providing a device area, on which is provided an active region. For example, for a GaN HEMT, an active area is provided by a GaN/AlGaN heterostructure that provides an active region comprising a 2DEG channel. Source, drain and gate electrodes are defined on the active region. For example, a first conductive layer, e.g. an ohmic contact layer, defines source finger electrodes and drain finger electrodes extending in a first direction across a width of an active region between first and second edges of the die. A gate metal layer defines gate finger electrodes extending between the source and drain finger electrodes. An interconnect structure, comprising source, drain and gate interconnects, is defined by first and second levels of interconnect metallization, and respective intermetal dielectric layers. The source, drain and gate interconnects are interconnected to respective underlying source, drain and gate finger electrodes. For example, as illustrated schematically in the simplified structure shown in FIG. 7A, a first conductive layer defines source finger electrodes 212 and drain finger electrodes 214. A gate metal layer defines gate finger electrode 216 between adjacent source and drain finger electrodes. First and second levels of interconnect metallization are patterned to provide a source bus 242 and a drain bus 244. The first and second levels of interconnect metallization are separated as appropriate by one or more intermetal dielectric layers. The source bus 242 runs across a centre region of the is interconnected by conductive vias 282 to the centre of underlying source finger electrodes 212. The drain bus 244 runs near the first edge of the active region and is interconnected by conductive vias 284 to the underlying drain finger electrodes 214. A gate bus 236 interconnects the gate finger electrodes 216 to a gate pad 266. The gate bus is run close to the centre of the die, i.e., adjacent to the source bus, or overlapping the source bus, to reduce or minimize the gate loop inductance. Gate return contact areas are provided. Running a dedicated gate return bus more effectively couples the gate and gate return buses, to provide lower gate loop inductance. A dedicated gate return bus also reduces variations in the gate inductance between the gate pad and the individual gate finger electrodes.

As illustrated schematically in FIG. 7B, after completion of the interconnect structure, the die is passivated by adding a die passivation layer 204, through which openings are formed to define areas for external contacts for the drain, source and gate connections. Pad metal is provided directly on the drain bus to provide drain pad 264 and on the source bus to provide source pad 262. Pad metal is provided on the gate contact areas to provide dual gate pads 266. Dual gate return pads 268 are also provided on the gate return contact areas. In this embodiment, each of the source pad and the drain pad are provided over the active device area. For a die which is to be packaged in a wirebonded package, the external contact pads may be referred to as bondpads, and the die may be referred to as having a bondpad-over-active topology.

Figure 8:
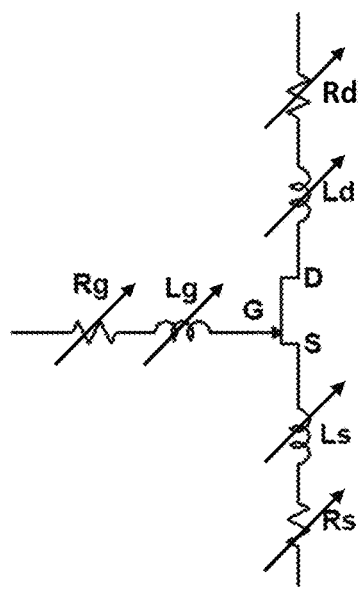
FIG. 8 shows an equivalent circuit schematic comprising inductances and resistances for a power transistor.

On-chip interconnect topologies may be optimized to reduce parasitic interconnect resistances and/or inductances to meet specific design objectives, as illustrated schematically in the equivalent circuit of FIG. 8. Positioning the source bus/pad and the drain bus/pad towards the centre of the source and drain fingers, e.g. as illustrated schematically in FIGS. 6A and 6B, will reduce inductances and resistances of the source and drain interconnect, $L_s$, $R_s$, $L_d$ and $R_d$. By placing the source pad at the centre of the source fingers, e.g. as illustrated schematically in FIGS. 7A and 7B, minimum values for Ls and Rs will be achieved. Gate inductance and resistance is also reduced by more central positioning of the gate bus, close to the source bus.

Figure 9:
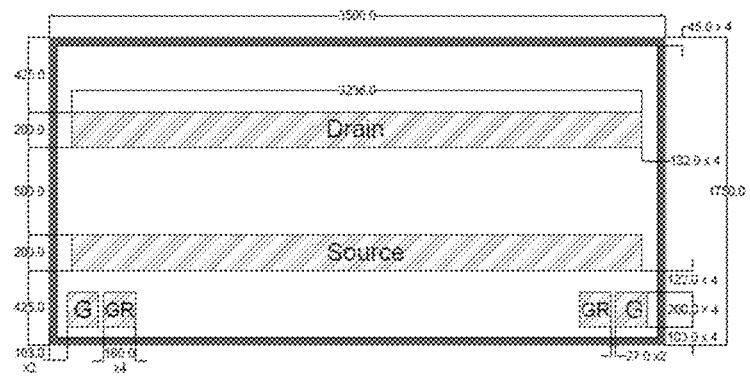
FIG. 9 is a schematic diagram of an example pad layout for a lateral power transistor showing dimensions for a specific die size, optimized to reduce source and drain resistances.

In the example device structure illustrated schematically in FIGS. 6A and 6B, the device interconnect topology is optimized to reduce source and drain resistances, by placing both the source and drain pads in a centre region of the die, spaced from the first and second edges. FIG. 9 is a schematic diagram of an example pad layout for a lateral GaN power transistor showing some example dimensions optimized for a specific die size, to reduce both source and drain inductances and resistances.

Figure 10:
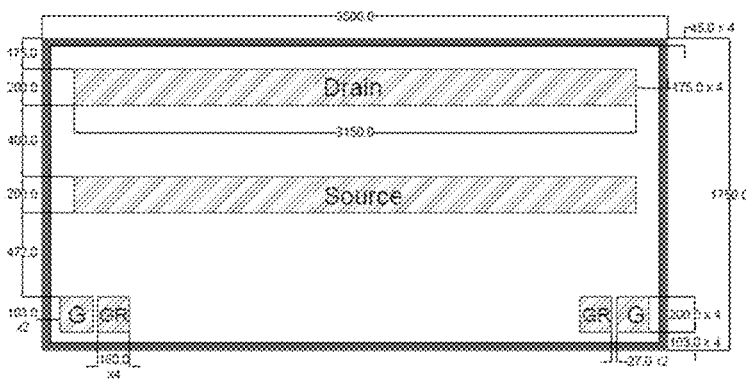
FIG. 10 is a schematic diagram of an example pad layout for a lateral power transistor of a second embodiment, showing dimensions for a specific die size, optimized to reduce common source inductance.

In the device structure of the first embodiment illustrated schematically in FIGS. 7A and 7B, the device interconnect topology is optimized to reduce source resistance and inductance, e.g. to reduce or minimize common source inductances. FIG. 10 is a schematic diagram of an example pad layout for a lateral GaN power transistor of a second embodiment, showing example dimensions optimized for a specific die size, to reduce or minimize common source inductance, while maintaining a required separation of the source bus and the drain bus.

Each level of interconnect metallization may comprise one or more conductive layers, to build up the source, drain and gate interconnect structures to the required thicknesses and lateral dimensions, e.g. for a required current carrying capacity and rated operational voltage, and to comply with design rules, clearances and other manufacturing constraints.

Figure 11A:
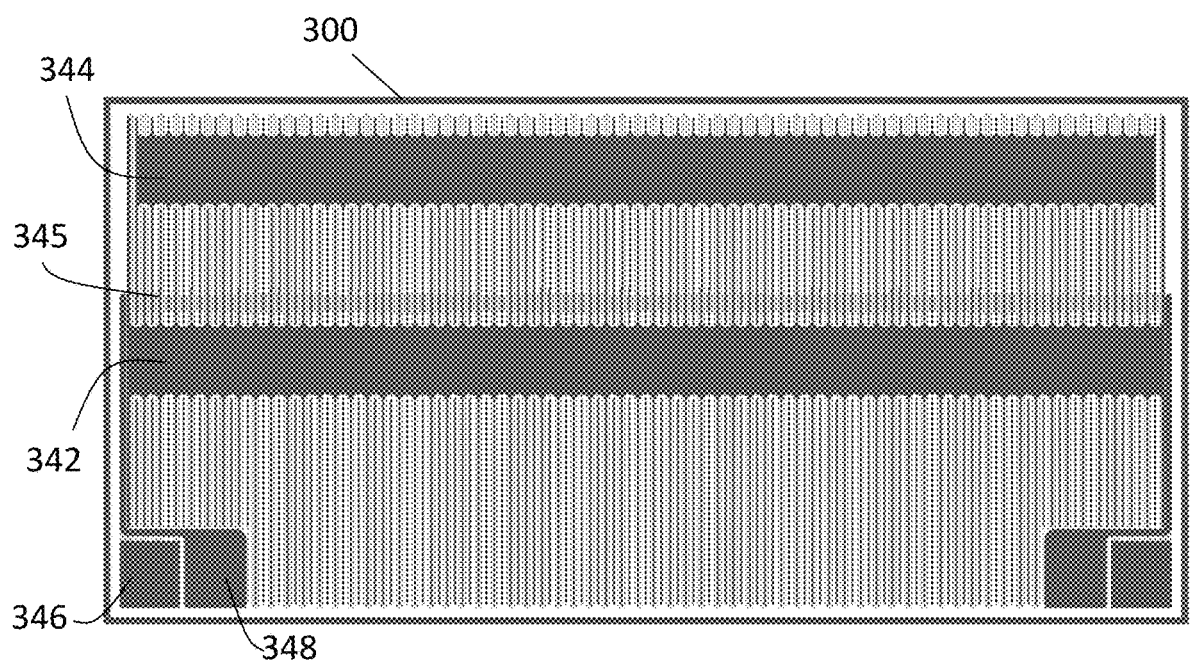
FIG. 11A shows a schematic diagram of an example device topology for implementing a power transistor of a third embodiment, showing an overlay of conductive layers comprising source, drain and gate finger electrodes; a source bus, a drain bus, a gate bus and gate return bus; and respective external contact pads.
Figure 11B:
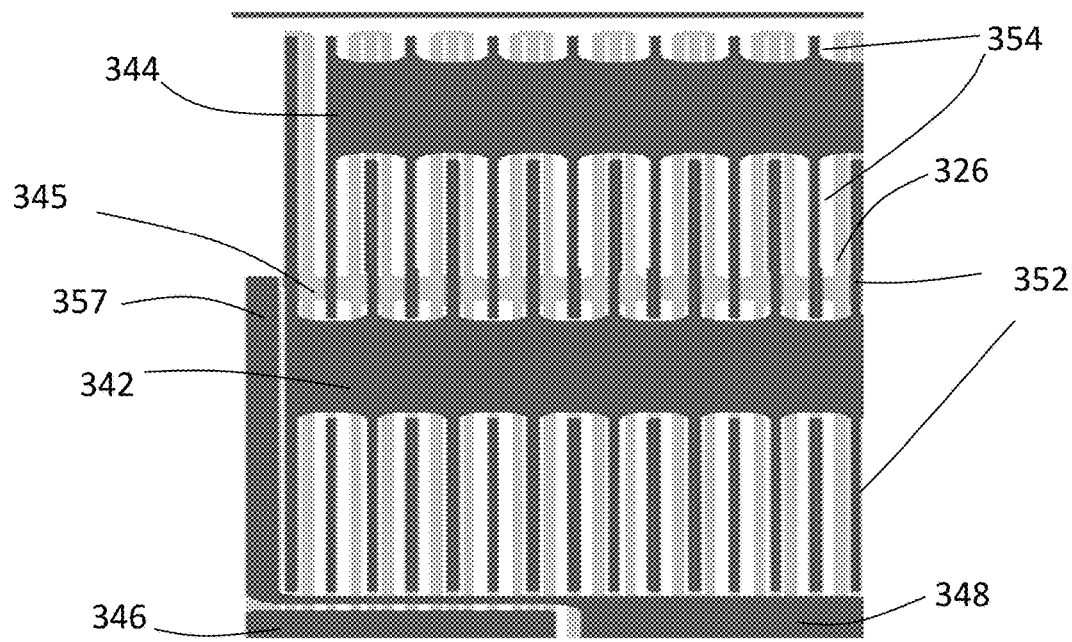
FIG. 11B shows an enlarged (laterally stretched out) view of part of FIG. 11A.

FIG. 11A shows a schematic diagram of a plan view 300-1 of an example device topology for implementing a power semiconductor device structure 300 comprising a power transistor of a third embodiment, showing an overlay of metallization layers comprising source, drain and gate finger electrodes, a source bus 342 and a drain bus 344. Gate contact areas 346 connect to a gate bus (not visible). Gate return contact areas 348 connect to a gate return bus 345, which overlies the gate bus. FIG. 11B show an enlarged (laterally stretched out) view of part 300-2 of the device structure shown in FIG. 11A in which corresponding parts are labelled with the same reference numeral. In this embodiment, as illustrated schematically, the second level metallization that defines the drain bus 344 is patterned to define tabs (lateral extensions or castellations) 354 that extend over, and provide contacts to, the underlying drain fingers 324. The lateral extensions 354 of the drain bus provide a more robust drain interconnect structure, which builds up the thickness of the drain fingers for improved current capacity and assists with distributing drain current laterally to the underlying drain finger electrodes. The source bus 342 is provided by the second level of metallization also includes tabs 352 (lateral extensions or castellations) that extend laterally in both directions from the source bus which helps the current carrying capability of the source bus. The gate bus underlies the gate return bus 345, which runs close to the source bus near the centre of the die. The gate bus connects to gate pads 346. The gate return bus 345 connects to gate return pads 348.

FIGS. 12A, 12B, 12C, 12D and 12E show simplified schematic diagrams comprising layers of a device topology for a power semiconductor device structure 400 comprising a lateral GaN power transistor having an interconnect structure of a fourth embodiment to show patterning of conductive metallization layers. As illustrated schematically in FIG. 12A, an active region 401, comprising a GaN/AlGaN heterostructure is provided on the device area of the die 400. The active region 401 is depicted schematically by the dashed outline. A first conductive layer, e.g. an ohmic contact layer, is patterned to define a plurality of source finger electrodes 412 and drain finger electrodes 414, which extend in a first direction across a width of the active area, between first and second edges of the active region. As illustrated schematically in FIG. 12B, an auxiliary level of metal comprising a gate metal layer defines gate finger electrodes 416 that run between each adjacent source and drain finger electrode, and a gate bus 426 which runs through a break in the source finger electrodes and drain finger electrodes. That is, the source finger electrodes 412 and drain finger electrodes 414 each comprise two portions. The gate metal layer may be referred to as Metal 0. The gate bus is connected to gate contact areas 436 located near each end of the die, near the second edge. The active region 401 may extend close to the edges of the die, to maximize use of the device area, e.g. to provide a large gate width and current capacity per unit device area.

Figure 12A:
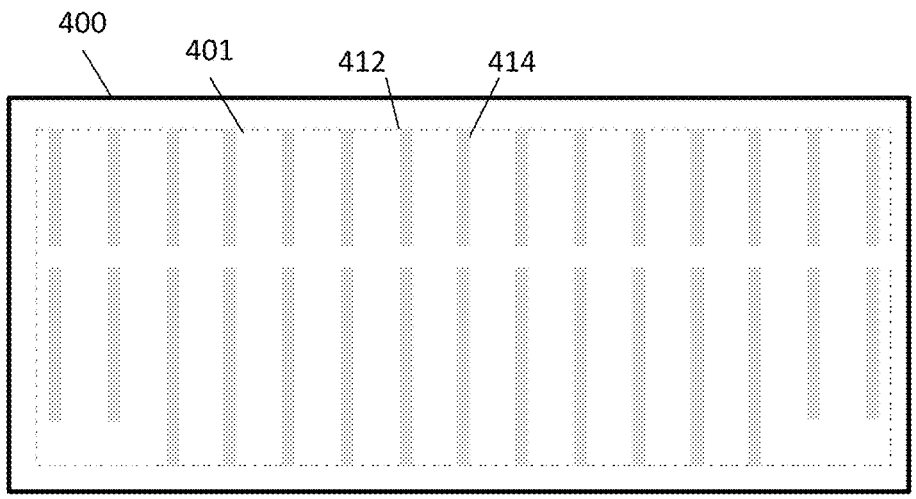
FIGS. 12A, 12B, 12C, 12D and 12E show simplified schematic diagrams representing layer structures for implementing a semiconductor device structure comprising a lateral GaN power transistor having a device topology of a fourth embodiment comprising a plurality of conductive metallization layers comprising first and second levels of interconnect metallization.
Figure 12B:
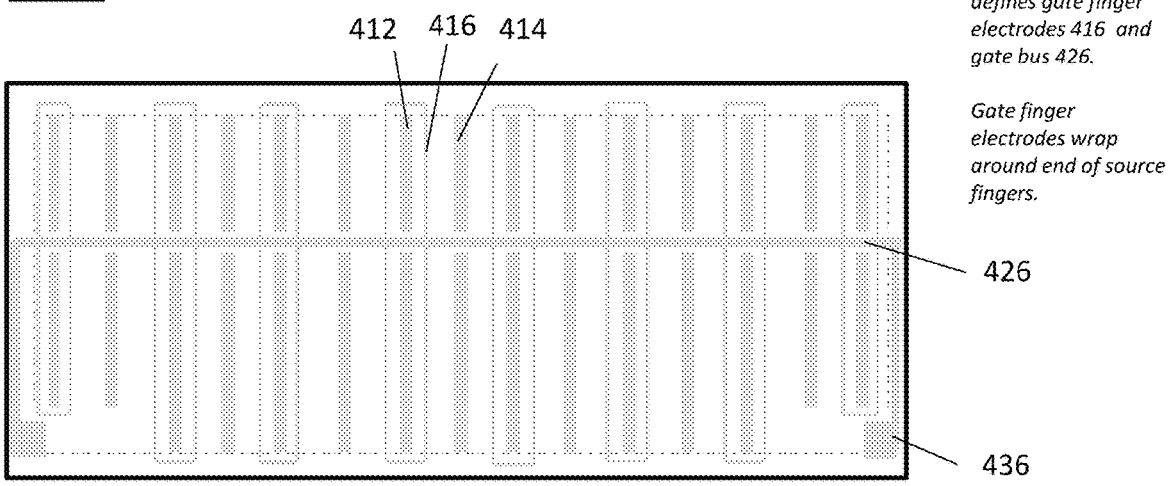
Figure 12C:
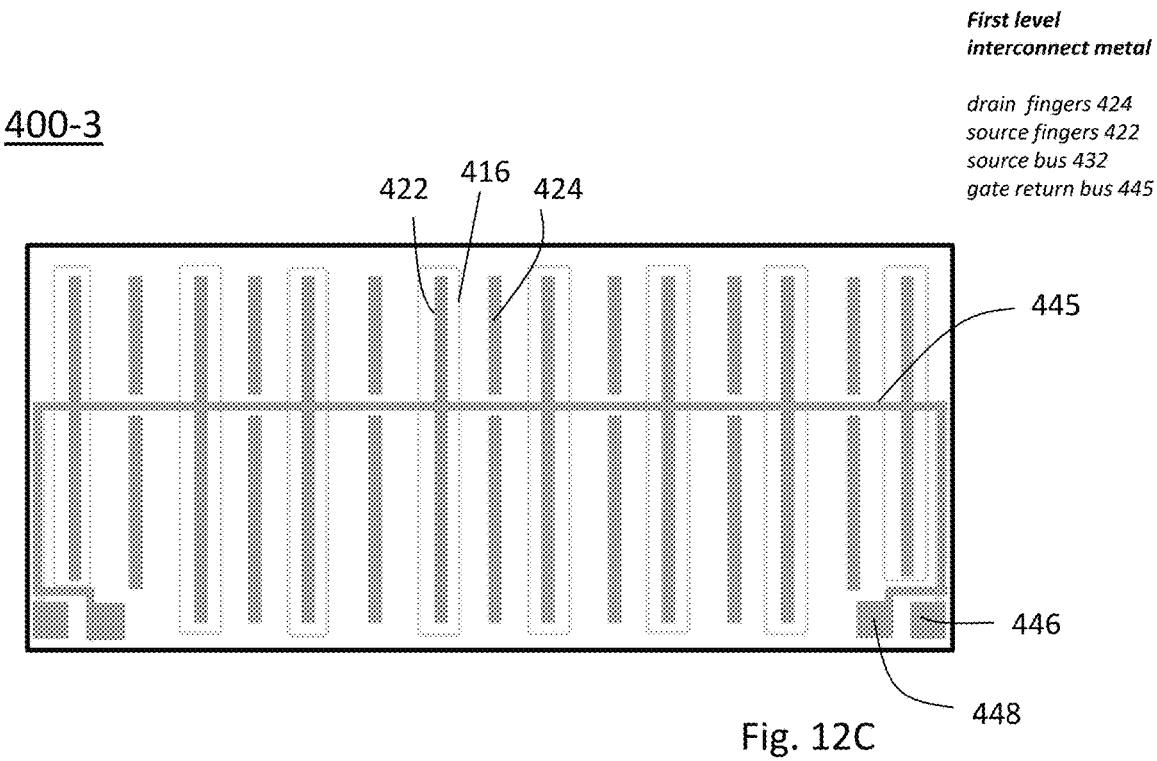
Figure 12D:
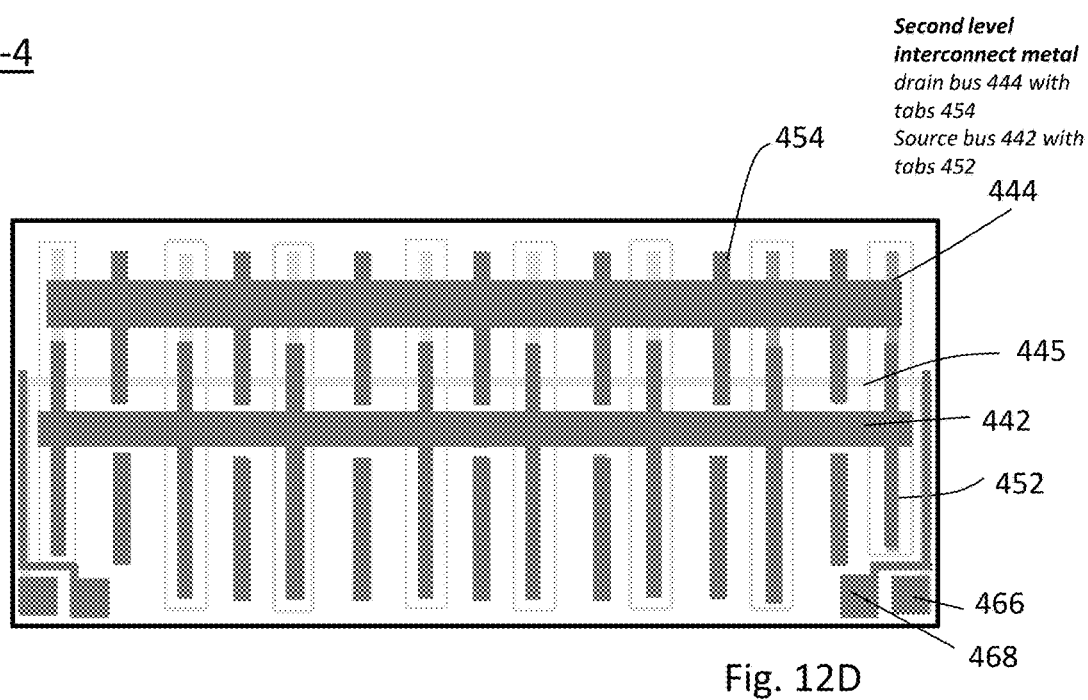
Figure 12E:
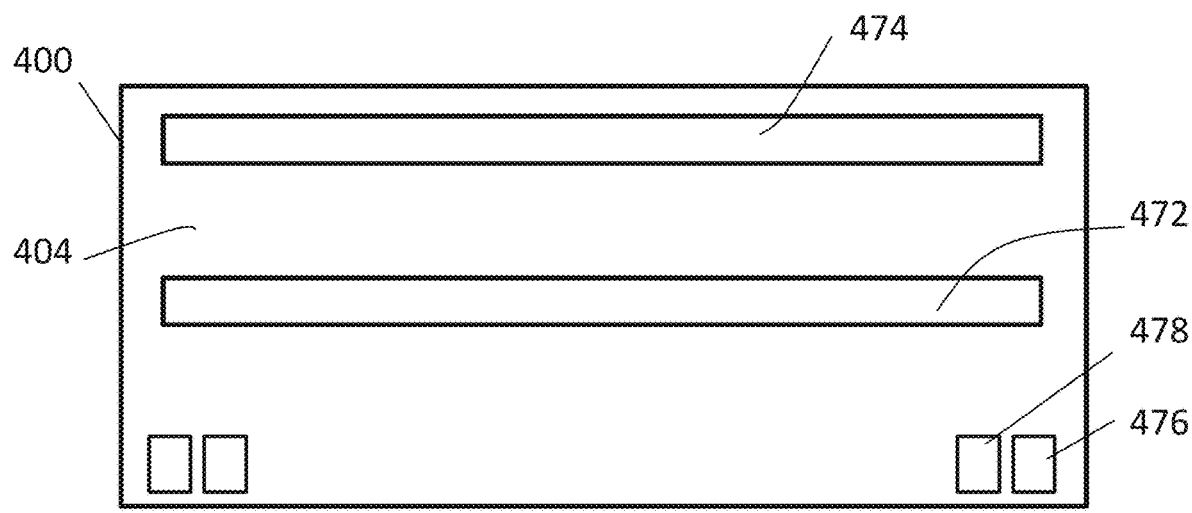

As illustrated schematically in FIG. 12C, a first level of interconnect metallization, which may be referred to as Metal 1, is patterned to provide source and drain interconnect structures comprising source fingers 422 and drain fingers 424 which contact the underlying source and drain finger electrodes, respectively. The first level of interconnect also provides a gate return bus 445 which interconnects to the source fingers. Gate contact areas 446 interconnect to the underlying gate bus 426 (shown in FIG. 12B). As illustrated schematically in FIG. 12D, a second level of interconnect metallization, which may be referred to as Metal 2, is patterned to provide a drain bus 444, a source bus 442 and a gate interconnections 446. The respective source, drain and gate interconnect structures of the different layers of metallization are interconnected through intervening inter-metal dielectric layers by conductive vias (not shown). In this embodiment, the drain bus 444 comprises tabs (lateral extensions or castellations) 454 that extend over the underlying drain fingers to increase the interconnect thickness and contact area of the drain bus 444. The source bus 442 is interconnected to the underlying source metal, and the source bus 442 also comprise tabs (lateral extensions or castellations) 452 that extend over the underlying source fingers to increase the interconnect thickness and contact area of the source bus 442. Gate return contact areas 468 are interconnected to the gate return bus. Gate contact areas 466 are interconnected to the underlying gate bus. As illustrated schematically in FIG. 12E, after completion of the interconnect structure comprising the first and second levels of metallization, the die is passivated with a die passivation layer 404, with pad metal is provided on the source bus and on the drain bus to form a source pad 472 and a drain pad 474, gate pads 466, and the gate return pads 478 Openings are provided in the die passivation 404 to the pad metal defining the external contact areas comprising the source pad 472, the drain pad 474, and dual gate pads 476 and gate return pads 478 at each end of the die (to provide an external structure similar to that shown in FIG. 7B).

As illustrated schematically for the embodiment shown in FIGS. 12A to 12E, the source bus extends across a middle region of the active area, substantially centered between the first and second edges of the active region, and the source bus has interconnections to each of the first and second portions of the source fingers. The source tabs (lateral extensions or castellations) extend laterally from the source bus over the source fingers, to reduce the source interconnect resistance and inductance. A dedicated gate return bus separates the gate drive loop from the power loop.

Figure 13:
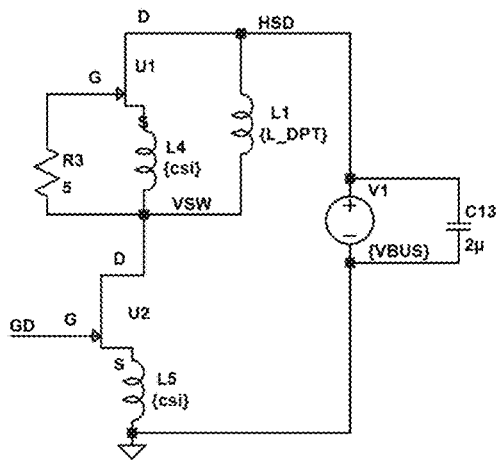
FIG. 13 shows a double pulse switching circuit comprising lateral GaN power switching transistors U1 and U2.
Figure 14:
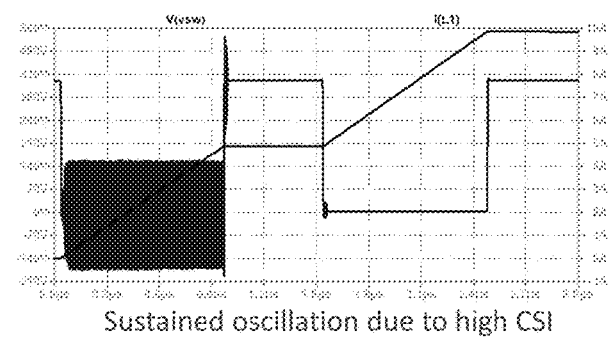
FIG. 14 shows a plot of voltage across U2 and current in inductor L1 vs. time to illustrate sustained oscillation due to a high common source inductance (CSI)
Figure 15:
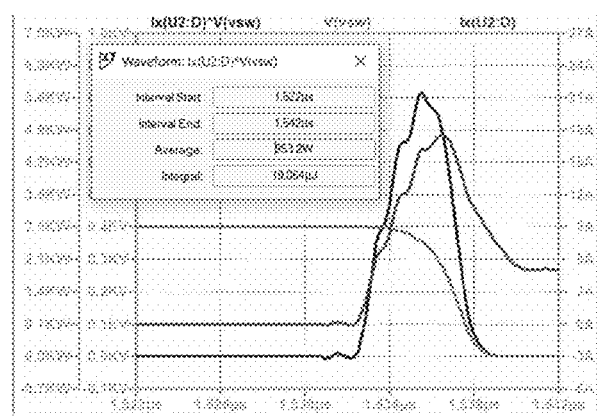
FIG. 15 shows the turn-on switching energy loss of the lateral GaN transistor U2 (blue waveform) in which the source bus runs in the middle of the die.
Figure 16:
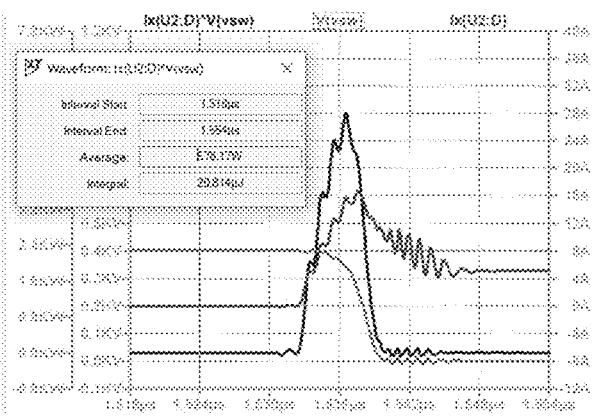
FIG. 16 shows the turn-on switching energy loss of lateral GaN transistor US (blue waveform) in which source bus does not run in the middle of the die.

Device topologies of these example embodiments, which provided with common source inductance, are applicable for GaN power switching devices, e.g. comprising lateral GaN HEMTs for high frequency switching with fast turn-on and turn-off times, e.g. on a nanosecond time scale. Applications include switching topologies such as buck converters and half-bridge converters. For example, FIG. 13 shows a circuit schematic for a double pulse switching circuit comprising first and second GaN power switching transistors U1 and U2, with common source inductances L4(csi) and L5(csi). FIG. 14 shows a plot of switching voltage (Vsw) vs. time to illustrate an example of sustained oscillation in a system with high common source inductance (CSI). FIGS. 15 and 16 show simulation results for devices of two example embodiments, showing waveforms for switching voltage V(vsw), U2 drain current Ix (U2:D), and the product of Ix (U2:D)*V(vsw). For example, FIG. 15 shows switching waveforms for a device having a topology such as shown in FIGS. 11A and 11B, wherein device layout is optimized to reduce CSI to 450 pH. FIG. 15 shows switching waveforms for a device having an interconnect topology optimized to reduce both source and drain impedances, which reduces CSI to 800 pH. Comparing FIG. 15 and FIG. 16, the device which is optimized to reduce CSI shows reduced oscillation in all waveforms, and a reduction of switching energy Eon from 20.8 μJ to 19 μJ.

That is, compared to the device structure of the embodiment shown in FIG. 9, where both source and drain buses are placed towards the centre region of the die, the device structure of the embodiment shown in FIG. 10 provides 40% lower CSI; 14% lower switching losses, higher stability in half-bridge circuits, and a minimally lower drain inductance. The device topology of FIG. 10 provides a 1% higher GaN Rdson (within measurement tolerance), and a lower EM limit.

The device topology of the third embodiment illustrated schematically in FIGS. 11A and 11B allows reduction or minimization of CSI by placement of the source bus and source pad in the centre of the die, running a dedicated gate return bus for the gate drive loop, and providing dedicated gate and gate return pads. This device topology may be implemented in a lateral GaN transistor process using first and second levels of interconnect metallization, e.g. as illustrated schematically in FIGS. 12A, 12B, 12C, 12D and 12E. Since the source pad and the drain pad, and the source and drain buses extend over the active area, this CUP device topology provides for maximizing usage of the active region of the die area, i.e. to provide a large current carrying capacity per unit device area. As noted above, each of the first and second levels of metallization may comprise one or more conductive metal layers, and corresponding intermetal dielectric layers.

In some alternative embodiments, a first level of metallization provides the gate bus, and second and third levels of metallization provide the source and drain buses.

Power switching devices with low CSI have better stability and lower switching losses for applications such as buck and half-bridge converters, and other power converter applications.

Device topologies for lateral power semiconductor devices of example embodiments have been described with reference to lateral GaN power transistors, such as lateral GaN HEMTs. These device topologies may also be applicable to other types of lateral power transistors.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A power semiconductor device structure comprising:
a lateral power transistor comprising a substrate providing a device area, an active region formed on the device area; a layer of conductive metallization defining an array of source and drain finger electrodes on the active region, the active region having a width and a length, each source and drain finger electrode extending across the width of the active region in a first direction between first and second edges of the active region,
a gate metal layer defining gate finger electrodes extending between each adjacent source and drain finger electrode;
an interconnect structure comprising interconnect metallization and intermetal dielectric;
the interconnect metallization defining a drain bus and a source bus;
the source bus extending in a second direction and being interconnected to the source finger electrodes;
the drain bus extending in the second direction and being interconnected to the drain finger electrodes; and
a source pad and a drain pad for external contacts being provided, respectively, on the source bus and the drain bus;
wherein:
the source bus runs near a centre of the source finger electrodes, and the drain bus is spaced from the source bus by at least a minimum specified distance for a rated operational voltage;
the gate metal layer provides a gate bus that runs between first and second portions of the source fingers electrodes and drain finger electrodes, the gate bus extending in the second direction and interconnecting the gate finger electrodes to gate contact areas; and
wherein the interconnect metallization defines a gate return bus overlying the gate bus.

2. The power semiconductor device structure of claim 1, wherein the source bus runs across a centre region and is substantially centered on each source finger electrode.

3. The power semiconductor device structure of claim 1, wherein the interconnect metallization comprises a gate bus extending in the second direction and interconnecting the gate finger electrodes to gate contact areas.

4. The power semiconductor device structure of claim 1, comprising first and second gate pads at each end of the second edge of the die.

5. The power semiconductor device structure of claim 1, wherein the source bus comprises tabs that extend laterally over, and interconnect with, the source finger electrodes.

6. The power semiconductor device structure of claim 1, wherein the drain bus comprises tabs that extend laterally over, and interconnect with, the drain finger electrodes.

7. The power semiconductor device structure of claim 1, wherein the source bus runs across a centre region, substantially centered between first and second edges of the active region, and the drain bus and source bus are separated by at least a minimum required separation for a rated operational voltage.

8. The power semiconductor device structure of claim 1, wherein the source bus runs across a centre region and is substantially centered on each source finger electrode between first and second edges of the active region, and the drain bus and source bus are separated by at least a minimum required separation for a rated operational voltage.

9. The power semiconductor device structure of claim 1, wherein the source bus runs across a centre region and is substantially centered between extremities of each source finger electrode between first and second edges of the active region, and the drain bus and source bus are separated by at least a minimum required separation for a rated operational voltage.

10. The power semiconductor device structure of claim 1, wherein the lateral power transistor is a lateral GaN power transistor.

11. The power semiconductor device structure of claim 10, wherein the lateral GaN power transistor is a lateral GaN HEMT.

12. The power semiconductor device structure of claim 11, rated for operational voltage of ≥100V.

13. The power semiconductor device structure of claim 11, rated for an operational voltage of ≥600V.

14. The power semiconductor device structure of claim 1, forming part of a half bridge converter, a buck converter, or other power switching topology.

15. The power semiconductor device structure of claim 1, wherein the interconnect metallization comprises a first level of metallization defining the gate bus and second and third levels of metallization defining the source bus and source fingers and the drain bus and drain fingers.

16. The device structure of claim 15, wherein the gate return bus is provided by the second level of metallization, the gate return bus overlying the gate bus and being interconnected to the source fingers, wherein the gate and gate return buses are laterally spaced from the source bus, and vertical interconnections from the drain bus to the drain fingers are routed between the source bus and the gate and gate return buses to interconnect first and second portions of the drain fingers.

17. A power semiconductor device structure comprising:
a lateral transistor structure comprising a substrate providing a device area, an active region formed on the device area; a layer of conductive metallization defining an array of source and drain finger electrodes on the active region, the active region having a width and a length, each source and drain finger electrode extending across the width of the active region in a first direction between first and second edges of the device active region,
a gate metal layer defining gate finger electrodes extending between each adjacent source and drain finger electrode, the gate metal layer defining a gate bus interconnecting the gate finger electrodes to gate contact areas, the gate bus running in a second direction between first and second portions of the source finger electrodes and drain finger electrodes;
an interconnect structure comprising first and second levels of interconnect metallization and intermetal dielectric;
the first level of interconnect metallization defining:
source fingers interconnected to the source finger electrodes; drain fingers interconnected to the drain finger electrodes; a source bus extending in the second direction and being interconnected to the source fingers; a gate return bus running in the second direction over the gate bus and interconnected to the source fingers;
the second level of interconnect metallization defining:
a source bus having laterally extending tabs interconnected to the source fingers of the first level of interconnect metallization;
a drain bus having laterally extending tabs interconnected to the drain fingers of the first level of interconnect metallization;
gate contact areas interconnected to the gate bus and the gate return bus being interconnected to the source fingers;
a source pad for external contacts provided on the source bus;
a drain pad for external contacts provided on the drain bus;
gate pads for external contacts provided on the gate contact areas and gate return pads for external contacts provided on the gate return contact areas wherein: the source bus runs across a centre region between first and second edges of the active region and is interconnected with the source fingers electrodes.

18. The power semiconductor device of claim 17, wherein the source bus is substantially centred on the source finger electrodes.

19. The power semiconductor device of claim 17, wherein the source finger electrodes comprises first and second portions and the source bus is substantially centred on the active region between extremities of the source fingers.

20. The power semiconductor device structure of claim 17 wherein the gate bus and the gate return bus run adjacent to the source bus.

21. The power semiconductor device structure of claim 17, wherein the source bus is substantially centered on a width of the active region between first and second edges of the active region, and interconnects with each source finger electrode, and the drain bus and source bus are separated by at least a minimum required separation for a rated operational voltage.

22. The power semiconductor device structure of claim 17, wherein the lateral power transistor is a lateral GaN HEMT.

23. The power semiconductor device structure of claim 22, rated for operational voltage of ≥100V.

24. The power semiconductor device structure of claim 22, rated for an operational voltage of ≥600V.

25. A power semiconductor device structure comprising:
a lateral power transistor comprising a substrate providing a device area, an active region formed on the device area; a layer of conductive metallization defining an array of source finger electrodes and drain finger electrodes on the active region, the active region having a width and a length, each source finger electrode and drain finger electrode extending across the width of the active region in a first direction between first and second edges of the active region,
a gate metal layer defining gate finger electrodes extending between each adjacent source and drain finger electrode;
the source finger electrodes and drain finger electrodes each comprising first and second portions with a break in between, the gate metal layer also defining a gate interconnection running between first and second portion of the source finger electrodes and drain finger electrodes, and interconnecting the gate finger electrodes;
an interconnect structure comprising interconnect metallization and intermetal dielectric;
the interconnect metallization defining a drain bus, a source bus and a gate bus;
the source bus extending in a second direction and being interconnected to each of the source finger electrodes;
the drain bus extending in the second direction and being interconnected to each of the drain finger electrodes;
a gate bus extending in the second direction and interconnecting each of the gate finger electrodes;
a source pad and a drain pad for external contacts being provided, respectively, on the source bus and the drain bus;
wherein: the source bus runs across the width of the active region substantial centred on the active region between first and second edges of the active region, and the drain bus is spaced from the source bus by at least a minimum specified distance for a rated operational voltage.

* * * * *